(12) United States Patent
Wantiez

(10) Patent No.: US 11,336,316 B2
(45) Date of Patent: May 17, 2022

(54) TRANSMISSION AND/OR RECEPTION OF RADIO FREQUENCY SIGNALS

(71) Applicant: Nokia Solutions and Networks Oy, Espoo (FI)

(72) Inventor: Eric Wantiez, Le Perray en Yvelines (FR)

(73) Assignee: Nokia Solutions and Networks Oy, Espoo (FI)

( * ) Notice: Subject to any disclaimer, the term of this patent is extended or adjusted under 35 U.S.C. 154(b) by 0 days.

(21) Appl. No.: 16/795,641

(22) Filed: Feb. 20, 2020

(65) Prior Publication Data
US 2020/0274562 A1    Aug. 27, 2020

(30) Foreign Application Priority Data

Feb. 25, 2019 (EP) .................................... 19159198

(51) Int. Cl.
*G06K 9/00* (2022.01)
*H04B 1/10* (2006.01)
*H03M 3/00* (2006.01)

(52) U.S. Cl.
CPC ............... H04B 1/10 (2013.01); H03M 3/30 (2013.01)

(58) Field of Classification Search
CPC .................................. H04B 1/10; H03M 3/30
See application file for complete search history.

(56) References Cited

U.S. PATENT DOCUMENTS

| | | | | |
|---|---|---|---|---|
| 5,386,215 A * | 1/1995 | Brown | ..................... | H01Q 1/38 343/792.5 |
| 5,600,342 A | 2/1997 | Pikulski et al. | | |
| 5,923,225 A * | 7/1999 | De Los Santos | ....... | H01P 3/081 330/149 |
| 6,975,269 B2 | 12/2005 | Jecko et al. | | |
| 7,522,105 B1 | 4/2009 | LaComb | | |
| 9,030,360 B2 | 5/2015 | Jerauld et al. | | |
| 9,515,387 B2 * | 12/2016 | Hung | ..................... | H01Q 1/521 |
| 2008/0278259 A1 * | 11/2008 | Ni | ........................ | H01P 1/2005 333/32 |
| 2009/0153433 A1 | 6/2009 | Nagai et al. | | |
| 2011/0012697 A1 * | 1/2011 | Takemura | ............ | H05K 1/0236 333/212 |

(Continued)

FOREIGN PATENT DOCUMENTS

| EP | 2330734 A1 | 6/2011 |
|---|---|---|
| EP | 2403136 A1 | 1/2012 |

OTHER PUBLICATIONS

Pendry et al., "Magnetism from Conductors and Enhanced Nonlinear Phenomena", IEEE Transactions on Microwave Theory and Techniques, vol. 47, No. 11, Nov. 1999, pp. 2075-2084.

(Continued)

*Primary Examiner* — Dhaval V Patel
(74) *Attorney, Agent, or Firm* — Harness, Dickey & Pierce, P.L.C.

(57) ABSTRACT

An apparatus comprising:
a sampler for over-sampling an input signal to produce a sampled input signal;
a delta-sigma modulator for modulating the sampled input signal to produce a modulated signal; and
a filter for filtering the modulated signal, the filter comprising:
a conductive patch and a ground plane separated by a dielectric
wherein the ground plane comprises a band-gap periodic structure.

14 Claims, 6 Drawing Sheets

(56) References Cited

U.S. PATENT DOCUMENTS

| | | | | |
|---|---|---|---|---|
| 2011/0122043 | A1* | 5/2011 | Ridgeway | H01Q 5/371 |
| | | | | 343/860 |
| 2012/0229318 | A1* | 9/2012 | Jin | H03H 7/075 |
| | | | | 341/155 |
| 2015/0280732 | A1* | 10/2015 | Beaulaton | H03M 3/404 |
| | | | | 341/143 |
| 2015/0332785 | A1* | 11/2015 | Steensgaard-Madsen | |
| | | | | G06F 30/3312 |
| | | | | 341/122 |
| 2019/0171331 | A1* | 6/2019 | Gray | G06F 3/03545 |
| 2020/0137932 | A1* | 4/2020 | Stikvoort | H05K 1/0231 |

OTHER PUBLICATIONS

Martin, "Artificial Transmission Lines for RF and Microwave Applications", Wiley Online Library, 2015, book cover, inside cover, Series Editor page, Chapter cover, copyright page, dedication page, Contents page, viii, ix-xii, Preface, xiv-xvi, Acknowledgements, xvili-xix, pp. 1-520, Wiley Series in Microwave and Optical Engineering—6 pages from Series Editor.

Weiglhofer et al., "Introduction to Complex Mediums for Optics and Electromagnetics", SPIE Press, 2003, book cover, inside cover, title page, copyright page dedication page, Contents p. viii, ix-xix, xx, xxi, Forward—xxi-xxiv, Preface—xxv-xxix, Contributors- xxxi-xxxiii, pp. 1-757, back cover page.

"Nonlinear Optics", Wikipedia, Retrieved on Feb. 20, 2020, Webpage available at: https://en.wikipedia.org/wiki/Nonlinear_optics, 14 pages.

"Refraction", Wikipedia, Retrieved on Feb. 20, 2020, Webpage available at: https://en.wikipedia.org/wiki/Refraction, 8 pages.

Veselago, "The Electrodynamics of Substances with Simultaneously Negative Values of $\epsilon$ and $\mu$", Soviet Physics Uspekhi, vol. 10, No. 4, Jan.-Feb. 1968, pp. 509-514.

"RT/duroid® 5870/5880 High Frequency Laminates", Rogers Corporation, Retrieved on Feb. 20, 2020, Webpage available at: https://rogerscorp.com/-/media/project/rogerscorp/documents/advanced-connectivity-solutions/english/data-sheets/rt-duroid-5870-5880-data-sheet.pdf, 2 pages.

"Radio Frequency", Wikipedia, Retrieved on Feb. 20, 2020, Webpage available at : https://en.wikipedia.org/wiki/Radio_frequency, 5 pages.

Liu et al., "Microstrip Antenna Array Using Photonic Bandgap Substrate", Sth International Symposium on Antenna Technology and Applied Electromagnetics, Jul. 31-Aug. 2, 2002, 5 pages.

Rai et al., "Design of Enhanced Gain Micro-strip Antenna Using Square Loop Shaped Meta-material Substrate", International Research Journal of Engineering and Technology (IRJET), vol. 5, No. 5, May 2018, pp. 3604-3609.

"An Overview: Photonic Band Gap Materials", Shodh Ganga, Retrieved on Feb. 25, 2020, Webpage available at : http://shodhganga.inflibnet.ac.in/bitstream/10603/34163/5/05_chapter%201.pdf, 52 pages.

Extended European Search Report received for corresponding European Patent Application No. 19159198.1, dated May 28, 2019, 10 pages.

Kim et al., "A Novel Photonic Bandgap Structure for Low-Pass Filter of Wide Stopband", IEEE Microwave and Guided Wave Letters, vol. 10, No. 1, Jan. 2000, pp. 13-15

Horii et al., "Harmonic Control by Photonic Bandgap on Microstrip Patch Antenna", IEEE Microwave and Guided Wave Letters, vol. 9, No. 1, Jan. 1999, pp. 13-15.

Communication pursuant to Article 94(3_ EPC dated Mar. 15, 2022 in European Application No. 19159198.1.

Pavan Shanthi et al., "Sampling, Oversampling, and Noise-Shaping in: Understanding Delta-Sigma Data Converters", John Wiley & Sons, Jan. 24, 2017.

Li Z et al., "Harmonic Suppression With Photonic Bandgap and Defected Ground Structure for a Miscrostrip Patch Antenna", IEEE Microwave and Wireless Components Letters, IEEE Service Center, vol. 15, No. 2, Feb. 1, 2005.

Rahmat-Samii Y. et al., "Electromagnetic band-gap structures: classification, characterization, and applications", Proc. IEE Eleventh International conference on Antennas and Propagation, vol. 2001, Jan. 1, 2001.

* cited by examiner

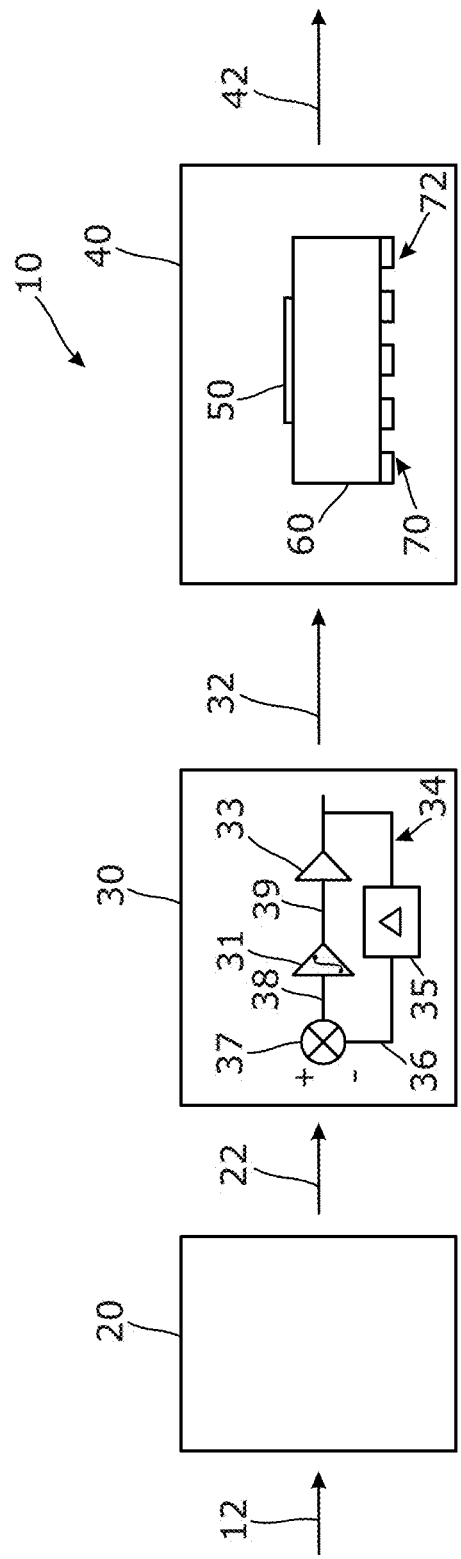
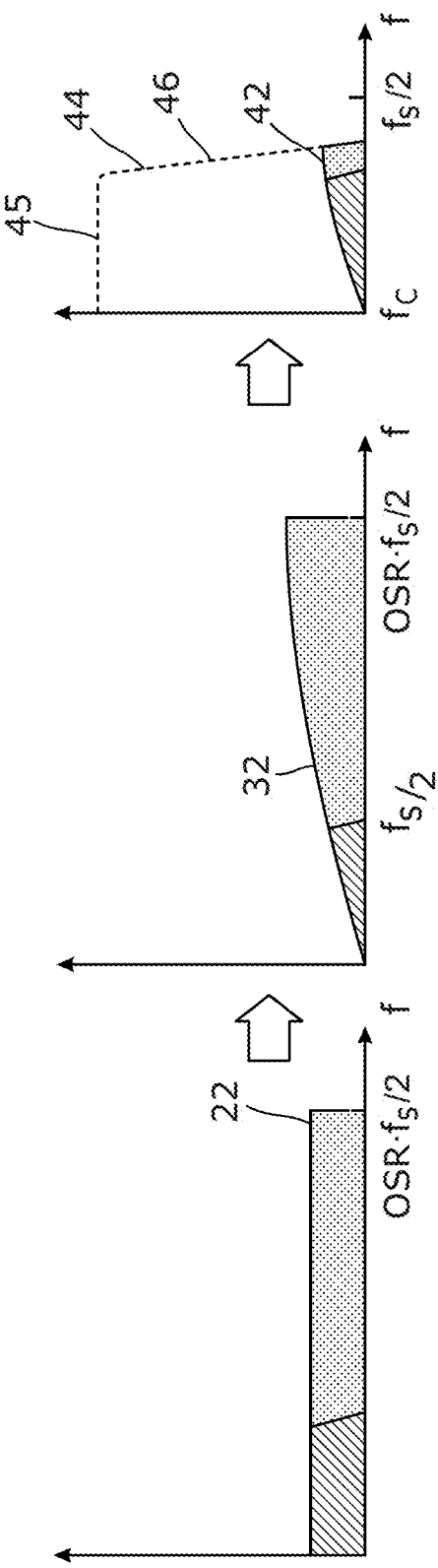
Fig. 1
Fig. 2A
Fig. 2B
Fig. 2C

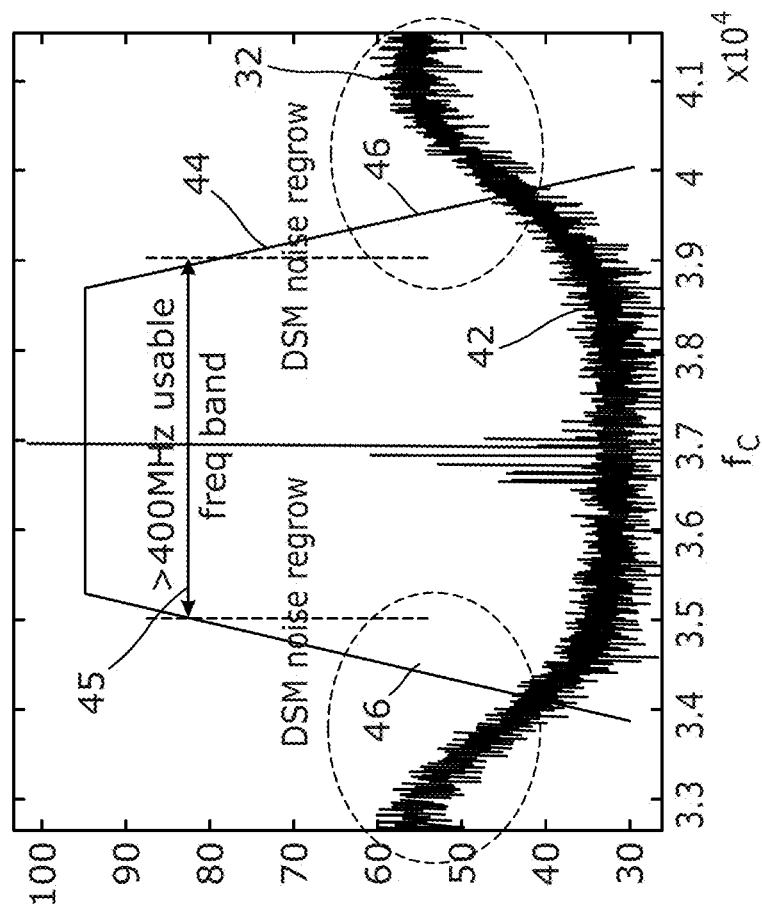
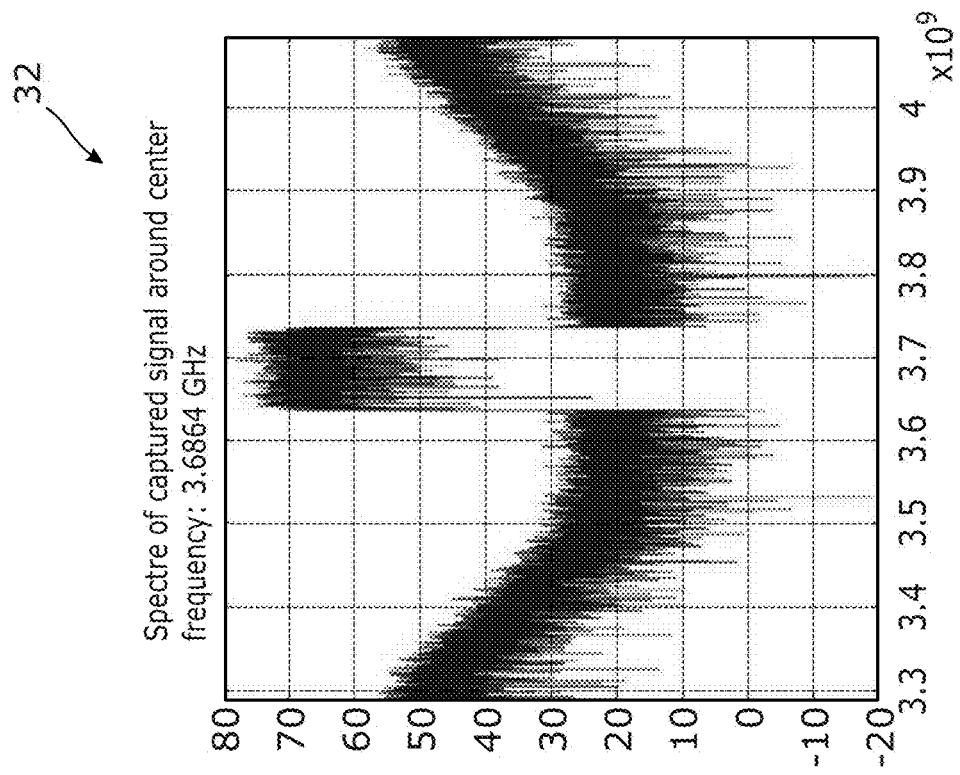
Fig. 3B
Fig. 3A

TRANSMISSION AND/OR RECEPTION OF RADIO FREQUENCY SIGNALS

CROSS-REFERENCE TO RELATED APPLICATION

This application claims the benefit of European patent application No. 19159198.1 filed on Feb. 25, 2019, titled "TRANSMISSION AND/OR RECEPTION OF RADIO FREQUENCY SIGNALS", the content of which is incorporated herein by reference in its entirety.

TECHNOLOGICAL FIELD

Embodiments of the present invention relate to transmission and/or reception of radio frequency signals.

BACKGROUND

In transmission and/or reception of radio frequency signals, radio frequency bandpass filters are often used to remove noise outside a frequency band of interest. Such filters can also attenuate the in-band signal, and additional amplification is typically required. The amount of amplification required is dependent upon an efficiency of the radio frequency band pass filter.

Filters can be bulky and additional amplification will consume electrical power.

BRIEF SUMMARY

According to various, but not necessarily all, embodiments there is provided an apparatus comprising:
a sampler for over-sampling an input signal to produce a sampled input signal;
a delta-sigma modulator for modulating the sampled input signal to produce a modulated signal; and
a filter for filtering the modulated signal, the filter comprising:
  a conductive patch and a ground plane separated by a dielectric
    wherein the ground plane comprises a band-gap periodic structure.

In some but not necessarily all examples, the over-sampling reduces a noise floor, the modulating causes noise shaping reducing noise in a frequency range of interest and increasing noise outside the frequency region of interest, and filtering attenuates more strongly outside the frequency region of interest than inside the frequency region of interest.

In some but not necessarily all examples, the filter has a frequency response configured to flatten a frequency response of the delta-sigma modulator.

In some but not necessarily all examples, the filter is configured to have a frequency response with a bandpass region centred on a centre frequency, and first regions adjacent and outside the bandpass region that provide a rapid increase in attenuation with distance from the central frequency.

In some but not necessarily all examples, the conductive patch is configured to have dual resonances that overlap.

In some but not necessarily all examples, the conductive patch is a rectangular patch.

In some but not necessarily all examples, the conductive patch comprises an asymmetric feed.

In some but not necessarily all examples, the feed has an interdigitated capacitive interface with the conductive patch.

In some but not necessarily all examples, the band-gap periodic structure is a photonic bandgap structure.

In some but not necessarily all examples, the band-gap periodic structure comprises periodically separated features in the ground plane, the ground plane being parallel to the conductive patch but separated therefrom by the dielectric.

In some but not necessarily all examples, the periodically separated features are holes in the ground plane. In some but not necessarily all examples, a period of the periodically separated features is configured to control a centre frequency of the filter. In some but not necessarily all examples, a size of the periodically separated features is configured to control a response of the filter.

In some but not necessarily all examples, the filter, for filtering the modulated signal, comprises an array of conductive patches separated from the ground plane by the dielectric.

According to various, but not necessarily all, embodiments there is provided an a method comprising:
method of processing an analogue signal to produce a modulated signal comprising over-sampling an input signal to produce a sampled input signal;
using a delta-sigma modulator to modulate the sampled input signal and produce a modulated signal; and
filtering the modulated signal, using a filter comprising:
  a conductive patch and a ground plane separated by a dielectric
    wherein the ground plane comprises a band-gap periodic structure.

According to various, but not necessarily all, embodiments there is provided examples as claimed in the appended claims.

BRIEF DESCRIPTION

Some example embodiments will now be described with reference to the accompanying drawings in which:

FIG. 1 shows an example embodiment of the subject matter described herein;

FIGS. 2A, 2B, 2C show an example embodiment of the subject matter described herein;

FIGS. 3A, 3B show an example embodiment of the subject matter described herein;

DETAILED DESCRIPTION

Figure 4A:
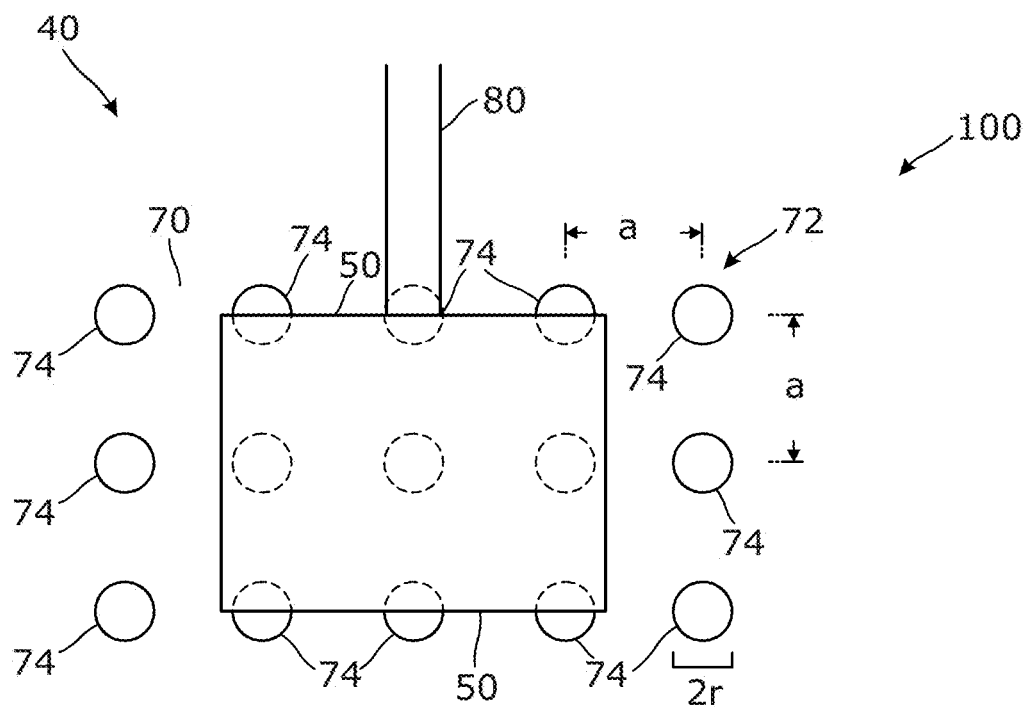
FIGS. 4A, 4B show an example embodiment of the subject matter described herein.

FIG. 1 illustrates an example of an apparatus 10 for transmitting a radio frequency signal 42.

The apparatus 10 comprises a sampler (also called DUC Digital Up Converter) 20, a delta-sigma modulator 30 and a filter 40 in series. An input signal 12 is provided to the sampler 20 and an output radio frequency signal 42 is transmitted by the filter 40.

In this example, but not necessarily all examples, the filter 40 is also an antenna for transmission of radio waves.

The sampler 20 is configured to over-sample the input signal 12 to produce a sampled input signal 22. The delta-sigma modulator 30 is configured to modulate the sampled input signal 22 to produce a modulated signal 32. The filter 40 is configured to filter the modulated signal 32 and output the output radio frequency signal 42.

The filter 40 comprises a conductive patch 50 and a ground plane 70 separated by a dielectric 60. The ground plane 70 comprises a band-gap periodic structure 72.

As will be appreciated from the following description, the apparatus 10 improves the signal to noise ratio while controlling out-of-band interference. The apparatus 10 provides an efficient transmission path that integrates the functions of bandpass filter and antenna removing the need for a discrete radio frequency bandpass filter. The apparatus 10 has high gain, low cost, low profile and high efficiency.

The delta-sigma modulator 30 has a forward path that uses integration 31 (a summation, sigma Σ) and a feedback path 36 that uses a difference 35 (delta Δ) for negative feedback. The feedback 36 is dependent on the integration 31 and the integration 31 is dependent on the feedback 36.

As will become clear from the description below, the integrator 31 acts as a low pass filter for the sampled input signal and a high pass filter for quantization noise.

In the particular example illustrated, but not necessarily all examples, the delta-sigma modulator 30 comprises a difference amplifier 37 that receives as inputs the sampled input signal 22 and the feedback 36 and outputs a difference 38. An integrator 31 receives as input the difference 38 and produces as an output an integrated difference 39. A comparator 33 receives as inputs the integrated difference 39 and a reference threshold clock (not shown). The comparator 33 outputs the modulated signal 32 which is latched by the clock. A feedback loop 34, in this example, includes a one-bit digital to analogue convertor 35 which receives as input the output signal 32 and produces as an output the feedback 36.

The delta-sigma modulator can have an order of 1 or higher using cascaded delta-sigma modulators.

The operation of the apparatus 10 can be understood in more detail from FIGS. 2A, 2B and 2C and FIGS. 3A and 3B. These figures illustrate frequency spectra of various signals.

FIG. 2A illustrates a frequency spectrum for the sampled input signal 22. The over-sampling by the sampler 20 reduces a noise floor and spreads noise in the frequency domain. According to the Nyquist-Shannon sampling theorem, for the given over-sampling rate $OSR*f_s$, perfect reconstruction is guaranteed possible for a bandwidth $B<OSR*f_s/2$.

As illustrated in FIG. 2B, the modulation by the sigma-delta modulator 30 causes noise shaping, reducing noise in the modulated signal 32 within a frequency range of interest ($<f_s/2$) and increasing noise outside the frequency region of interest ($\geq f_s \div 2$).

As illustrated in FIG. 2C, filtering by the filter 40 attenuates more strongly outside the frequency region of interest than inside the frequency region of interest to produce the radio frequency output signal 42.

The over-sampling rate OSR may, for example, be of the order 10. However, it may be a different value.

FIG. 3A illustrates a spectrum of a 20 MHz LTE modulated signal 32, at 3.68 GHz, produced by the delta-sigma modulator 30 illustrated in FIG. 1, which for this example is a $3^{rd}$ order delta-sigma modulator 30. It can be seen that there is significant noise regrowth at the peripheral edges of the spectrum. FIG. 3B illustrates a frequency-response for the filter 40. It can be seen that the filter 40 significantly attenuates the noise regrowth caused by the delta-sigma modulation. This effectively removes or reduces out-of-band noise which can be requirement for telecommunication standards. The filter 40 has particularly high gain in the frequency region of interest and the filtered, modulated signal, the output signal 42, has a high signal to noise ratio.

As can be seen from FIGS. 2C and 3B, the filter 40 has a frequency response 44 configured to flatten a frequency response of the delta-sigma modulator 30. The filter 40 is configured to have a frequency response 44 with a band pass region 45 centered on a center frequency $f_c$ and first regions 46 adjacent and outside the band pass region 45 that provide a rapid increase in attenuation with distance from the central frequency $f_c$.

Figure 4B:
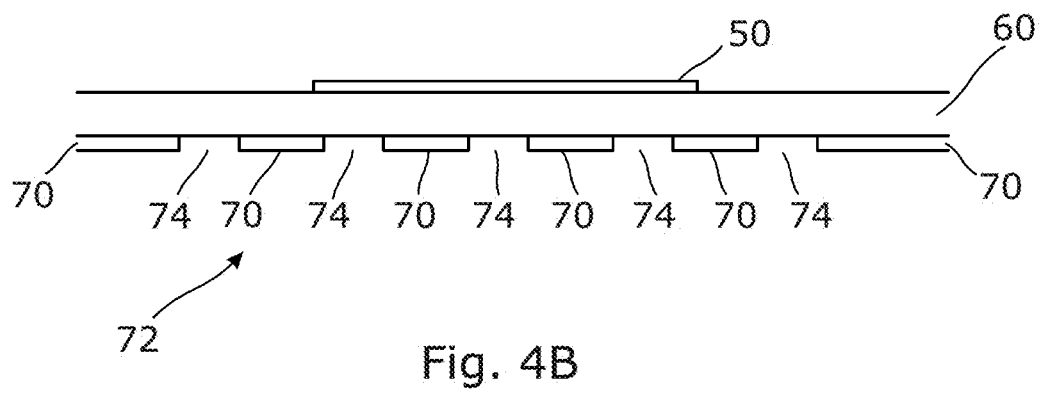

FIG. 4 illustrates in more detail an example of the filter 40 which operates as an antenna 100. FIG. 4A is a plan view from above looking down upon the conductive patch 50 and FIG. 4B is a cross-sectional view similar to that schematically shown in FIG. 1.

The filter 40 comprises a conductive patch 50 and a ground plane 70 separated by a dielectric 60. The ground plane 70 comprises a band-gap periodic structure 72.

In this example, the band-gap periodic structure 72 is a photonic band-gap structure (also known as an electronic band-gap structure).

The band-gap periodic structure 72 comprises periodically separated features 74 in the ground plane 70. The features 74 are arranged in a regular two-dimensional array. The two-dimensional array has the features 74 arranged in rows and columns where the rows have a regular constant separation distance and the columns also have a regular constant separation distance. In the particular example illustrated, but not necessarily all examples, the array is a square array in which the columns and the rows are separated by the same distance a.

In FIG. 4A, the portions of the features 74 that are not obscured in this view by the conductive patch 50 are illustrated using solid lines and the portions of the features 74 that are obscured, in this view, by the conductive patch 50 are illustrated using dotted lines.

As illustrated in FIG. 4B, the features 74, in this example, are holes in the ground plane 70. In this example, the holes are through-holes that extend all of the way through the ground plane 70 to expose the dielectric substrate 60. However, in other examples different periodic features 74 may be used to create the band-gap periodic structure 72.

In some examples, the features 74 may be holes that are etched in the conductive ground plane 70.

The period of the periodically separated features can be configured to control a center frequency $f_c$ of the filter 40. Increasing the separation distance a between the features 74 increases an effective "resonant wavelength" of the filter 40 and decreases the resonant frequency of the filter 40. This decreases the center frequency $f_c$. Decreasing the separation distance a between the periodic features 74, decreases the "resonant wavelength" and increases the resonant frequency of the filter 40. This increases the center frequency $f_c$.

The size of the periodically separated features 74 can be configured to control the frequency response 44 of the filter 40. The size of the periodically separated features 74 can, for example, be used to control a Q-factor of the resonances associated with the band-gap periodic structure 72.

In some, but not necessarily all, examples, it is desirable to use circular features 74 that have a radius r and that are separated by a distance a where 4r=a.

It will be appreciated that in this example, the conductive patch 50 is a planar rectangular patch. However, in other examples it may have a different configuration, for example, a different shape.

The conductive patch 50 operates as an antenna 100 and has a feed 80.

As can be seen from the example illustrated in FIG. 4B, the ground plane 70 is a conductive ground plane that is parallel to the conductive patch 50 but is separated therefrom by the dielectric 60. The dielectric 60 may be any suitable dielectric. It may, for example, be a dielectric substrate. A dielectric substrate 60 may, for example, be formed from dielectric glass microfibre reinforced PTFE composite for example Duroid™. The dielectric substrate 60 may, for example, be of the order of 1-3 mm thick.

Figure 5:
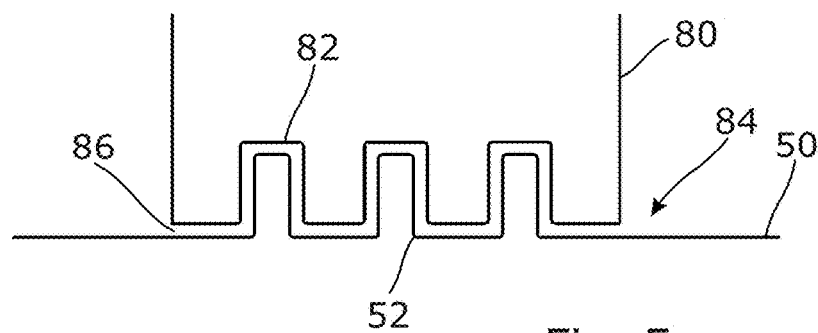
FIG. 5 shows an example embodiment of the subject matter described herein.
Figure 6A:
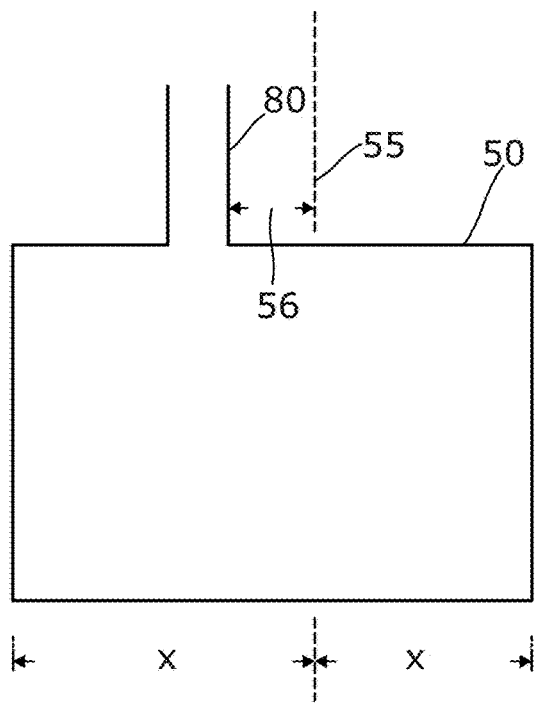
FIG. 6A shows an example embodiment of the subject matter described herein.
Figure 6B:
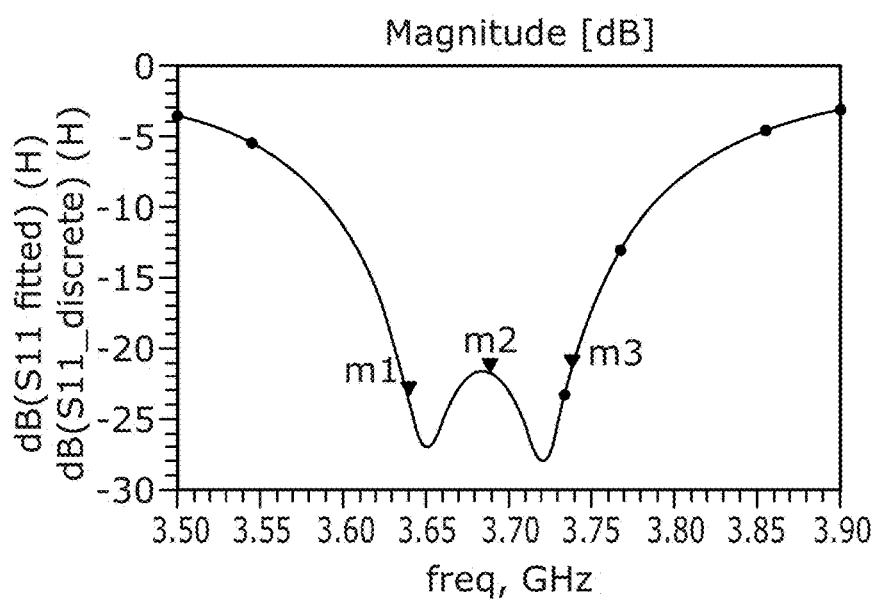
FIG. 6B shows an example embodiment of the subject matter described herein.

Some, optional, modifications may be made to the filter 40 illustrated in FIG. 5, 6A, or 6B to control the performance of the filter 40.

Referring to FIG. 5, in some but not necessarily all examples, an interface 84 between the antenna feed 80 and the conductive patch 50 can be an interdigitated capacitive interface 84. The interdigitated capacitive interface 84 has a zig-zag gap 86 between the feed 80 and the conductive patch 50. In this example, the portion 82 of the feed 80 that forms the interface 84 has crenellations and the portion of the patch 50 that forms the interface 84 has corresponding crenellations. The crenellations of the conductive feed 80 and the conductive patch 50 intermesh without touching but have a gap 86 between them.

In some, but not necessarily all, examples, the antenna feed 80 may be asymmetrically positioned with respect to the conductive patch 50. FIG. 6A illustrates a line of reflection symmetry 55 that bisects the conductive patch 50. The interface between the antenna feed 80 and the conductive patch 50 is offset 56 from the line of reflection symmetry 55. This, and other techniques, such as using parasitic resonators, may be used to provide a filter 40 that has dual resonances which overlap as illustrated in FIG. 6B. In this particular example, the asymmetric feed 80 of the conductive feed 50 has created dual resonances that overlap.

Figure 7:
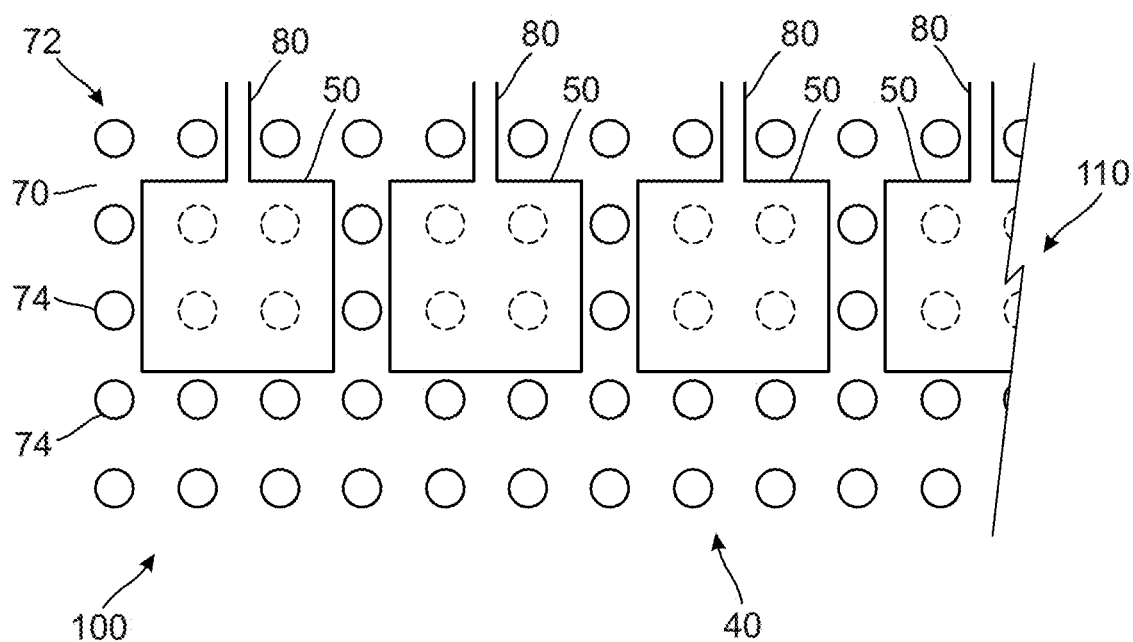
FIG. 7 shows an example embodiment of the subject matter described herein.

FIG. 7 illustrates another example of the filter 40 previously described. In this example, the filter 40, which operates as an antenna 100, comprises an array 110 of conductive patches 50. Each of the conductive patches 50 are separated from a common ground plane 70 by a common dielectric (not illustrated). The ground plane 70, which is common to all of the conductive patches 50, comprises a band-gap periodic structure 72. The band-gap periodic structure and the conductive patches 50 can, for example, be as described previously.

In some, but not necessarily all, examples, the antenna arrangement 100 illustrated in FIG. 7 can be used for multiple input multiple output (MIMO) operation. In particular, it is suitable for use in massive multiple input multiple output (mMIMO) operation, where the array 110 of conductive patches 50 comprises, for example, more than 64 conductive patches 50. It is expected that such mMIMO antenna arrangements 100 (antenna arrays) will find application for beam steering, for example at frequencies less than 6 GHz. The antenna arrangement 100 is periodic and uniform. The individual conductive patches 50 can show exactly the same behavior making the array uniform.

Figure 8:
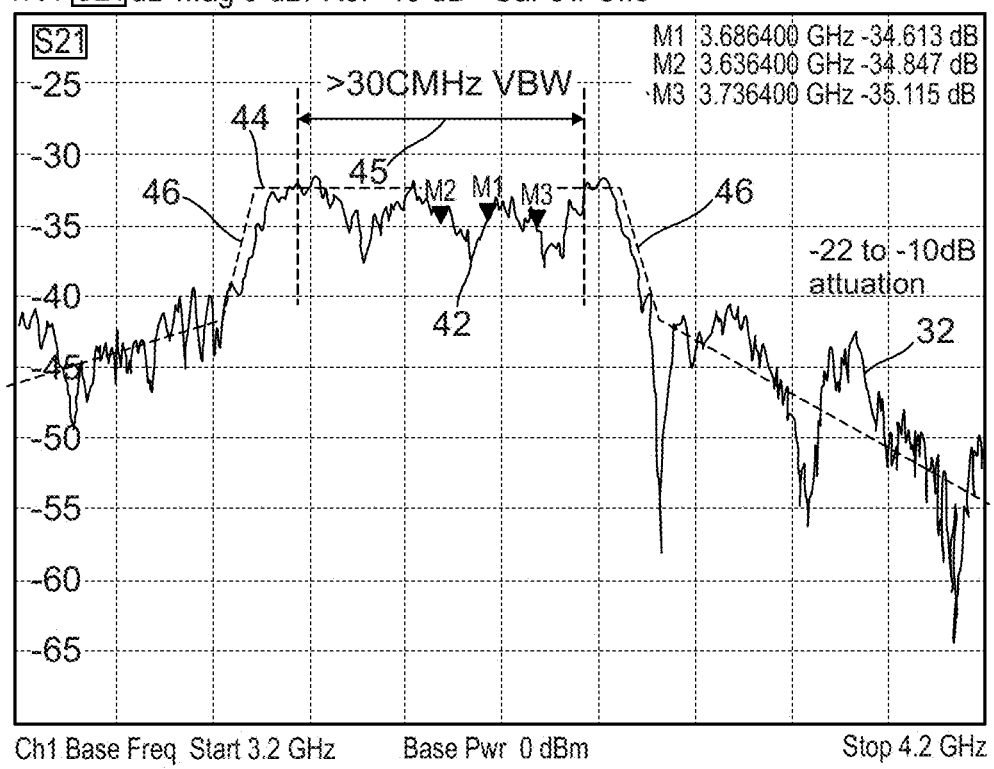
FIG. 8 shows an example embodiment of the subject matter described herein.

FIG. 8 illustrates an example of a frequency response for the antenna arrangement 100 illustrated in FIG. 7. Similar reference numerals are used to label similar frequencies and the description in relation to FIG. 3B is also relevant for FIG. 8.

Figure 9:
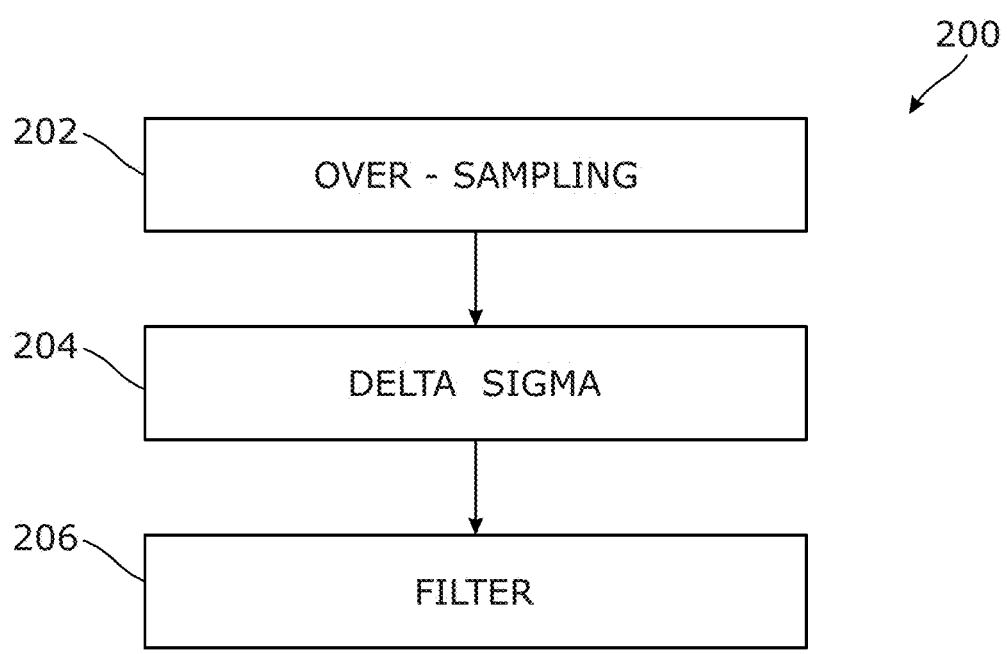
FIG. 9 shows an example embodiment of the subject matter described herein.

FIG. 9 illustrates an example of a method 200 for processing an input signal 12 to produce a radio frequency output signal 42, the method comprising:

at block 202, over-sampling an input signal 12 to produce a sampled input signal 22;

at block 204, using a delta-sigma modulator 30 to modulate the sampled input signal 22 and produce a modulated signal 32; and at block 206, filtering the modulated signal 32 using a filter 40 comprising: a conductive patch 50 and a ground plane 70 separated by a dielectric 60, wherein the ground plane 70 comprises a band-gap periodic structure 72.

The antenna or antenna arrangement 100 in some examples is an antenna or antenna arrangement for a transmitter or transceiver. For example, a base transceiver station in a cellular telecommunications network such as a base transceiver station, a NodeB, an E-NodeB or a g-NodeB; an access node in a wireless network e.g. Wi-Fi, or a terminal in a cellular telecommunications network.

Where a structural feature has been described, it may be replaced by means for performing one or more of the functions of the structural feature whether that function or those functions are explicitly or implicitly described.

The apparatus 100 may be part of the Internet of Things forming part of a larger, distributed network.

The antenna or antenna arrangement 100 may be configured to operate in one or a plurality of operational resonant frequency bands. For example, the operational frequency bands may include (but are not limited to) Long Term Evolution (LTE) (US) (734 to 746 MHz and 869 to 894 MHz), Long Term Evolution (LTE) (rest of the world) (791 to 821 MHz and 925 to 960 MHz), amplitude modulation (AM) radio (0.535-1.705 MHz); frequency modulation (FM) radio (76-108 MHz); Bluetooth (2400-2483.5 MHz); wireless local area network (WLAN) (2400-2483.5 MHz); hiper local area network (HiperLAN) (5150-5850 MHz); global positioning system (GPS) (1570.42-1580.42 MHz); US-Global system for mobile communications (US-GSM) 850 (824-894 MHz) and 1900 (1850-1990 MHz); European global system for mobile communications (EGSM) 900 (880-960 MHz) and 1800 (1710-1880 MHz); European wideband code division multiple access (EU-WCDMA) 900 (880-960 MHz); personal communications network (PCN/DCS) 1800 (1710-1880 MHz); US wideband code division multiple access (US-WCDMA) 1700 (transmit: 1710 to 1755 MHz, receive: 2110 to 2155 MHz) and 1900 (1850-1990 MHz); wideband code division multiple access (WCDMA) 2100 (transmit: 1920-1980 MHz, receive: 2110-2180 MHz); personal communications service (PCS) 1900 (1850-1990 MHz); time division synchronous code division multiple access (TD-SCDMA) (1900 MHz to 1920 MHz, 2010 MHz to 2025 MHz), ultra wideband (UWB) Lower (3100-4900 MHz); UWB Upper (6000-10600 MHz); digital video broadcasting-handheld (DVB-H) (470-702 MHz); DVB-H US (1670-1675 MHz); digital radio mondiale (DRM) (0.15-30 MHz); worldwide interoperability for microwave access (WiMax) (2300-2400 MHz, 2305-2360 MHz, 2496-2690 MHz, 3300-3400 MHz, 3400-3800 MHz, 5250-5875 MHz); digital audio broadcasting (DAB) (174.928-239.2 MHz, 1452.96-1490.62 MHz); radio frequency identification low frequency (RFID LF) (0.125-0.134 MHz); radio frequency identification high frequency (RFID HF) (13.56-13.56 MHz); radio frequency identification ultra high frequency (RFID UHF) (433 MHz, 865-956 MHz, 2450 MHz).

An operational frequency band is a frequency band over which an antenna can efficiently operate. It is a frequency range where the antenna's return loss is less than an operational threshold.

The above described examples find application as enabling components of: automotive systems; telecommunication systems; electronic systems including consumer electronic products; distributed computing systems; media systems for generating or rendering media content including audio, visual and audio visual content and mixed, mediated, virtual and/or augmented reality; personal systems including personal health systems or personal fitness systems; navigation systems; user interfaces also known as human machine interfaces; networks including cellular, non-cellular, and optical networks; ad-hoc networks; the internet; the internet of things; virtualized networks; and related software and services.

The term 'comprise' is used in this document with an inclusive not an exclusive meaning. That is any reference to X comprising Y indicates that X may comprise only one Y or may comprise more than one Y. If it is intended to use 'comprise' with an exclusive meaning then it will be made clear in the context by referring to "comprising only one." or by using "consisting".

In this description, reference has been made to various examples. The description of features or functions in relation to an example indicates that those features or functions are present in that example. The use of the term 'example' or 'for example' or 'can' or 'may' in the text denotes, whether explicitly stated or not, that such features or functions are present in at least the described example, whether described as an example or not, and that they can be, but are not necessarily, present in some of or all other examples. Thus 'example', 'for example', 'can' or 'may' refers to a particular instance in a class of examples. A property of the instance can be a property of only that instance or a property of the class or a property of a sub-class of the class that includes some but not all of the instances in the class. It is therefore implicitly disclosed that a feature described with reference to one example but not with reference to another example, can where possible be used in that other example as part of a working combination but does not necessarily have to be used in that other example.

Although embodiments have been described in the preceding paragraphs with reference to various examples, it should be appreciated that modifications to the examples given can be made without departing from the scope of the claims Features described in the preceding description may be used in combinations other than the combinations explicitly described above.

Although functions have been described with reference to certain features, those functions may be performable by other features whether described or not.

Although features have been described with reference to certain embodiments, those features may also be present in other embodiments whether described or not.

The term 'a' or 'the' is used in this document with an inclusive not an exclusive meaning. That is any reference to X comprising a/the Y indicates that X may comprise only one Y or may comprise more than one Y unless the context clearly indicates the contrary. If it is intended to use 'a' or 'the' with an exclusive meaning then it will be made clear in the context. In some circumstances the use of 'at least one' or 'one or more' may be used to emphasis an inclusive meaning but the absence of these terms should not be taken to infer and exclusive meaning.

The presence of a feature (or combination of features) in a claim is a reference to that feature or (combination of features) itself and also to features that achieve substantially the same technical effect (equivalent features). The equivalent features include, for example, features that are variants and achieve substantially the same result in substantially the same way. The equivalent features include, for example, features that perform substantially the same function, in substantially the same way to achieve substantially the same result.

In this description, reference has been made to various examples using adjectives or adjectival phrases to describe characteristics of the examples. Such a description of a characteristic in relation to an example indicates that the characteristic is present in some examples exactly as described and is present in other examples substantially as described.

Whilst endeavoring in the foregoing specification to draw attention to those features believed to be of importance it should be understood that the Applicant may seek protection via the claims in respect of any patentable feature or combination of features hereinbefore referred to and/or shown in the drawings whether or not emphasis has been placed thereon.

The invention claimed is:

1. An apparatus comprising:
   a sampler for over-sampling an input signal to produce a sampled input signal;
   a delta-sigma modulator for modulating the sampled input signal to produce a modulated signal; and
   a filter for filtering the modulated signal, the filter comprising
      a ground plane comprising a band-gap periodic structure,
      an array of conductive patches above the band-gap periodic structure, and
      a dielectric separating the band-gap periodic structure and the conductive patch,
   wherein the filter has a frequency response configured to flatten a frequency response of the delta-sigma modulator, and
   wherein the band-gap periodic structure comprises a two-dimensional array of periodically separated features in the ground plane.

2. The apparatus of claim 1, wherein the over-sampling reduces a noise floor, the modulating causes noise shaping reducing noise in a frequency range of interest and increasing noise outside the frequency region of interest, and the filtering attenuates more strongly outside the frequency region of interest than inside the frequency region of interest.

3. The apparatus of claim 1, wherein the filter is configured to have a frequency response with a bandpass region centred on a centre frequency, and first regions adjacent and outside the bandpass region configured to provide a rapid increase in attenuation with distance from the central frequency.

4. The apparatus of claim 1, wherein at least one of the conductive patches is configured to have dual resonances that overlap.

5. The apparatus of claim 1, wherein at least one of the conductive patches is a rectangular patch.

6. The apparatus of claim 1, wherein at least one of the conductive patches comprises an asymmetric feed.

7. The apparatus of claim 6, wherein the asymmetric feed has an interdigitated capacitive interface with the at least one conductive patch.

8. The apparatus of claim 1, wherein the band-gap periodic structure is a photonic bandgap structure.

9. The apparatus of claim 1, wherein the ground plane is parallel to the array of conductive patches but separated therefrom by the dielectric.

10. The apparatus of claim 9, wherein the periodically separated features are holes in the ground plane.

11. The apparatus of claim 9, wherein a period of the periodically separated features is configured to control a centre frequency of the filter.

12. The apparatus of claim 9, wherein a size of the periodically separated features is configured to control a response of the filter.

13. A method of processing an analogue signal to produce a modulated signal comprising:
   over-sampling an input signal to produce a sampled input signal;
   using a delta-sigma modulator to modulate the sampled input signal and produce a modulated signal; and
   filtering the modulated signal using a filter, the filter comprising
      a ground plane including a band-gap periodic structure, an array of conductive patches above the band-gap periodic structure, and a dielectric separating the band-gap periodic structure from the conductive patch,
   wherein the filter has a frequency response configured to flatten a frequency response of the delta-sigma modulator, and
   wherein the band-gap periodic structure comprises a two-dimensional array of periodically separated features in the ground plane.

14. The apparatus of claim 1, wherein
the features of the band-gap periodic structure have a radius, and the radius is a factor of a distance between the features.

* * * * *

UNITED STATES PATENT AND TRADEMARK OFFICE
CERTIFICATE OF CORRECTION

| | |
|---|---|
| PATENT NO. | : 11,336,316 B2 |
| APPLICATION NO. | : 16/795641 |
| DATED | : May 17, 2022 |
| INVENTOR(S) | : Eric Wantiez |

It is certified that error appears in the above-identified patent and that said Letters Patent is hereby corrected as shown below:

On the Title Page

On second page, at item (56), OTHER PUBLICATIONS:
"MARTIN, "Artificial Transmission Lines for RF and Microwave Applications", ... xvili-xix,..."
Should read:
-- MARTIN, "Artificial Transmission Lines for RF and Microwave Applications",... xviii-xix, ... --
"LIU et al., "Microstrip Antenna Array Using Photonic Bandgap Substrate", Sth International Symposium on Antenna Technology and Applied Electromagnetics, ..."
Should read:
-- LIU et al., "Microstrip Antenna Array Using Photonic Bandgap Substrate", 9th International Symposium on Antenna Technology and Applied Electromagnetics, ... --

Signed and Sealed this
Thirtieth Day of August, 2022

Katherine Kelly Vidal
*Director of the United States Patent and Trademark Office*